(12) United States Patent
Xu et al.

(10) Patent No.: US 10,586,813 B2
(45) Date of Patent: Mar. 10, 2020

(54) ARRAY SUBSTRATE WITH HOLLOW DISPLAY REGION, PRIMARY AND SECOND DATA LINES AND AUXILIARY DATA LINES, AND DISPLAY PANEL AND DISPLAY DEVICE THEREOF

(71) Applicant: SHANGHAI TIANMA MICRO-ELECTRONICS CO., LTD., Shanghai (CN)

(72) Inventors: Chuanzhi Xu, Shanghai (CN); Zhengfang Xie, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 36 days.

(21) Appl. No.: 16/112,792

(22) Filed: Aug. 27, 2018

(65) Prior Publication Data

US 2018/0366495 A1 Dec. 20, 2018

(30) Foreign Application Priority Data

Oct. 31, 2017 (CN) .......................... 2017 1 1047456

(51) Int. Cl.
*H01L 27/12* (2006.01)
*G06F 3/044* (2006.01)
*G02F 1/1362* (2006.01)
*G02F 1/1368* (2006.01)

(52) U.S. Cl.
CPC ...... *H01L 27/124* (2013.01); *G02F 1/136209* (2013.01); *G02F 1/136286* (2013.01); *G06F 3/044* (2013.01); *H01L 27/1218* (2013.01); *G02F 1/1368* (2013.01); *G02F 2201/122* (2013.01); *G02F 2201/56* (2013.01)

(58) Field of Classification Search
CPC ............... H01L 27/1218; H01L 27/124; G02F 1/136209; G02F 1/136286; G06F 3/044
See application file for complete search history.

(56) References Cited

U.S. PATENT DOCUMENTS

| 2015/0068882 A1* | 3/2015 | Huang | .................. G06F 3/044 200/5 R |
| 2019/0212839 A1* | 7/2019 | Wang | ...................... G06F 3/041 |

FOREIGN PATENT DOCUMENTS

CN 107221281 A 9/2017

* cited by examiner

*Primary Examiner* — Andrew Q Tran
(74) *Attorney, Agent, or Firm* — Kilpatrick Townsend & Stockton, LLP (57) ABSTRACT

An array substrate, a display panel and a display device are provided. The array substrate includes a display region and a border region. The border region includes a first border and a second border arranged oppositely in a first direction. The display region includes a hollowed-out region, a second sub-display region and a primary display region, a data drive port located in the border region and data lines extended in the first direction. The data lines include second data lines located in the second sub-display region and auxiliary data lines located in the primary display region. The data drive port provides a data signal to sub-pixels in the second sub-display region through the auxiliary data lines and the second data lines.

12 Claims, 5 Drawing Sheets

ARRAY SUBSTRATE WITH HOLLOW DISPLAY REGION, PRIMARY AND SECOND DATA LINES AND AUXILIARY DATA LINES, AND DISPLAY PANEL AND DISPLAY DEVICE THEREOF

CROSS REFERENCE OF RELATED APPLICATION

The present application claims the priority to Chinese Patent Application No. 201711047456.3, titled "ARRAY SUBSTRATE, DISPLAY PANEL AND DISPLAY DEVICE", filed on Oct. 31, 2017 with the State Intellectual Property Office of the PRC, which is incorporated herein by reference in its entirety.

FIELD

The present disclosure relates to the technical field of display, and in particular to an array substrate, a display panel and a display device.

BACKGROUND

As a display panel is widely applied to a variety of electronic devices, for example the display panel has been widely used in smartphones, tablet personal computers, laptop computers, digital cameras, portable cameras, personal digital assistants (PDAs), thin televisions and other electronic devices, a research on the display panel becomes increasingly deep.

An annular display panel is taken as an example. A hollowed-out region is arranged in a central portion of the display panel, and upper and lower display regions are formed due to blocking of the hollowed-out region, the upper and lower display regions are discontinuous. For a data line that generally penetrates through a column of sub-pixels in a vertical direction, the data line is blocked due to the hollowed-out region. Therefore, it is impossible to use a drive design in the conventional technology to drive the display panel with the hollowed-out region.

Therefore, an urgent problem to be solved in the art is to provide a complete solution for driving the display panel with the hollowed-out region.

SUMMARY

In view of this, an array substrate, a display panel and a display device are provided according to the present disclosure, which solve a technical problem that a display panel with a hollowed-out region cannot be driven by using a drive design according to the conventional technology.

In order to solve the above technical problem, an array substrate is provided according to the present disclosure, which includes: a display region; a border region surrounding the display region; a data drive port; second data line; and auxiliary data lines. The border region includes a first border and a second border arranged oppositely in a first direction. The display region includes a hollowed-out region, a second sub-display region and a primary display region. The second sub-display region is a region from an edge of the hollowed-out region near the second border to the second border. The data drive port is arranged in the first border, the second data lines are arranged in the second sub-display region, and the auxiliary data lines are arranged in the primary display region. The second data lines and the auxiliary data lines are extended in the first direction, and the auxiliary data lines and the second data lines are arranged in a one-to-one correspondence manner. The second data lines are connected to the corresponding auxiliary data lines and sub-pixels in the second sub-display region, and the auxiliary data lines are connected to the data drive port.

In an embodiment of the present disclosure, the array substrate further includes a connection wire. The second data lines are connected to the corresponding auxiliary data lines via the connection wire.

In an embodiment of the present disclosure, the array substrate further includes a first sub-display region, where the first sub-display region is a region from an edge of the hollowed-out region near the first border to the first border. The array substrate further includes first data lines, where the first data lines are connected to the data drive port and sub-pixels in the first sub-display region, and the auxiliary data lines are connected to the corresponding first data lines via the connection wire.

In an embodiment of the present disclosure, the display region further includes multiple sub-pixels arranged in an array, and the auxiliary data lines and the primary data lines are arranged in parallel between two adjacent columns of the sub-pixels.

In an embodiment of the present disclosure, the array substrate further includes virtual data lines and common electrode signal lines. The virtual data lines are connected to the common electrode signal lines. The primary data line and one of the auxiliary data line and the virtual data line are arranged between two adjacent columns of the sub-pixels in the primary display region.

In an embodiment of the present disclosure, the array substrate further includes touch electrodes and touch signal lines. The touch signal lines are connected to the corresponding touch electrodes. In the primary display region, the primary data line and one of the auxiliary data line and the touch signal line are arranged between two adjacent columns of the sub-pixels.

In an embodiment of the present disclosure, the primary display region includes a first primary display region and a second primary display region arranged oppositely in a second direction. The second direction and the first direction intersect with each other. The auxiliary data lines include first auxiliary data lines located in the first primary display region and second auxiliary data lines located in the second primary display region. The number of the first auxiliary data lines is equal to the number of the second auxiliary data lines.

In an embodiment of the present disclosure, the array substrate further includes a first metal layer and a second metal layer arranged in an insulating manner and spaced from each other. The first metal layer includes the connection wire, and the second metal layer includes the second data lines, the auxiliary data lines and the primary data lines.

In an embodiment of the present disclosure, the first metal layer further includes scanning lines.

In an embodiment of the present disclosure, the display region and the hollowed-out region are circular, and a center of the display region coincides with a center of the hollowed-out region.

In order to solve the above technical problem, according to another embodiment of the present disclosure, a display panel is provided according to the present disclosure, which includes any one of the array substrates according to the present disclosure.

In order to solve the above technical problem, according to another embodiment of the present disclosure, a display device is provided according to the present disclosure, which includes the display panel described above.

Compared with the conventional technology, an array substrate, a display panel and a display device provided according to the present disclosure achieve the following beneficial effects. The array substrate is provided with a hollowed-out region. For a region where data lines are blocked by the hollowed-out region, that is, the second sub-display region, second data lines are arranged and auxiliary data lines are arranged in the primary display region; the second data lines are connected to a data drive port via the auxiliary data lines to drive the display panel with the hollowed-out region, thereby being beneficial to a narrow border design of the display device and improving the display uniformity of the display device.

Embodiments of the present disclosure will become clear through the following detailed description of the exemplary embodiments of the present disclosure in conjunction with the drawings.

BRIEF DESCRIPTION OF THE DRAWINGS

The drawings, which are combined in the specification and form a part of the specification, show embodiments of the present disclosure and are used for explaining the principle of the present disclosure together with the description of the drawings.

DETAILED DESCRIPTION

Various exemplary embodiments of the present disclosure are described in detail with reference to the drawings. It should be noted that relative arrangement of components and steps, numerical expressions and values clarified in the embodiments are not intended to limit the scope of the present disclosure, unless otherwise specified.

The following description of the at least one exemplary embodiment is merely illustrative and shall not be constructed as any limitation on the disclosure and its application or use.

In all examples shown and described herein, any specific value should be illustrated as merely exemplary, rather than limitation. Therefore, different values may be used in other examples of exemplary embodiments.

Figure 1:
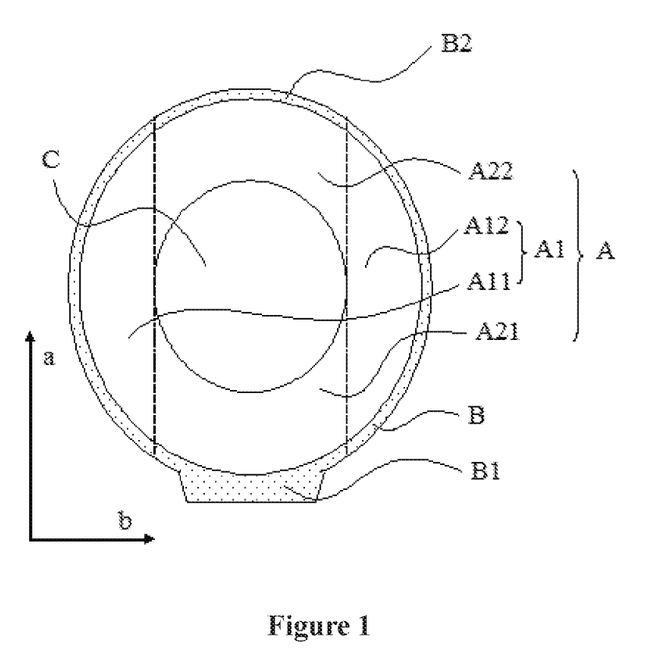
FIG. 1 is a schematic top view showing a structure of an array substrate according to an embodiment of the present disclosure.
Figure 2:
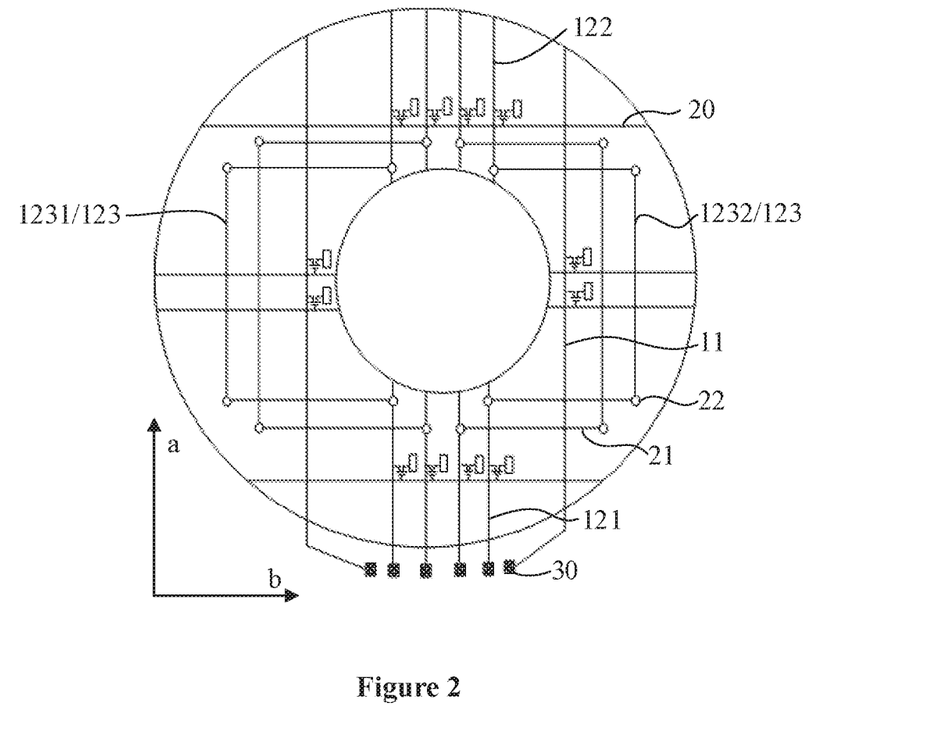
FIG. 2 is a schematic diagram showing wiring of an array substrate according to an embodiment of the present disclosure.
Figure 3:
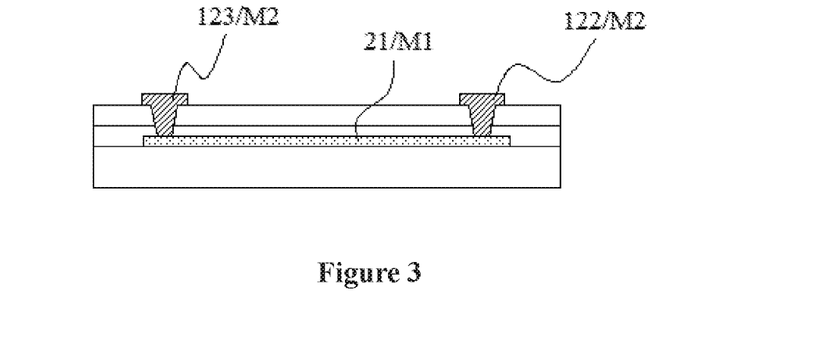
FIG. 3 is a cross-sectional view of an array substrate according to an embodiment of the present disclosure.
Figure 4:
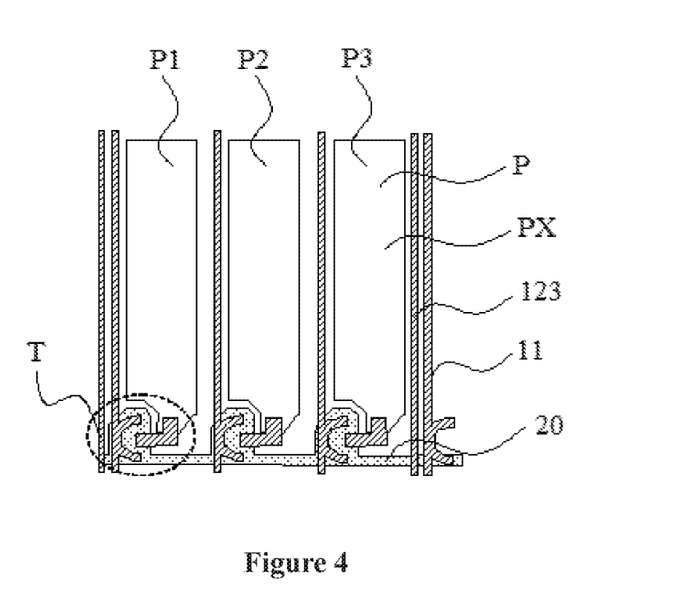
FIG. 4 is a schematic diagram of a pixel unit of an array substrate according to an embodiment of the present disclosure.

FIG. 1 is a schematic top view showing a structure of an array substrate according to an embodiment of the present disclosure. FIG. 2 is a schematic diagram showing wiring of an array substrate according to an embodiment of the present disclosure. FIG. 3 is a cross-sectional view of an array substrate according to an embodiment of the present disclosure. FIG. 4 is a schematic diagram of a pixel unit of an array substrate according to an embodiment of the present disclosure.

As shown in FIGS. 1 to 4, an array substrate according to the present disclosure includes a display region A and a border region B surrounding the display region A. The display region A includes multiple sub-pixels P for image display. The border region B is provided with a drive circuit that drives the sub-pixels to display an image. The border region B includes a first border B1 and a second border B2 arranged oppositely in a first direction a. The display region A includes a hollowed-out region C, a first sub-display region A21, a second sub-display region A22 and a primary display region A1. The first sub-display region A21 is a region from an edge of the hollowed-out region C near the first border B1 to the first border B1 in the display region A, and the second sub-display region A22 is a region from an edge of the hollowed-out region C near the second border B2 to the second border B2 in the display region A. The hollowed-out region C may be located at a central portion of the display region A or located near an edge of the display region A at a side.

The array substrate further includes a drive circuit arranged in the border region B, multiple sub-pixels P arranged in an array which are located in the display region A, data lines (such as lines 11, 121 and 122 in FIG. 2) arranged in the display region and extended in a first direction a (a vertical direction in FIG. 2), and scanning lines 20 arranged in the display region A and extended in a second direction b (a horizontal direction in FIG. 2). The data lines and the scanning lines are arranged to intersect, and multiple sub-pixels P arranged in an array are defined. Each of the sub-pixels P is provided with pixel electrodes PX and thin film transistors T. The thin film transistor T may be arranged, for example, at an intersection position of the scanning line and the data line. Multiple thin film transistors T are arranged in a matrix, and the pixel electrodes PX are connected to the corresponding data lines via the thin film transistors T.

The drive circuit includes a data drive port 30 that may provide a display signal to the data lines. The drive circuit may be an integrated circuit chip IC. In the embodiment, the data drive port 30 is located in the first border B1.

The data lines include primary data lines 11 located in the primary display region A1, first data lines 121 located in the first sub-display region A21 and second data lines 122 located in the second sub-display region A22. The primary data lines 11 are connected to the sub-pixels in the primary display region A1 and the data drive port 30, and the first data lines 121 are connected to the sub-pixels in the first sub-display region A21 and the data drive port 30.

Moreover, the primary display region A1 further includes auxiliary data lines 123. The auxiliary data lines 123, for example, may be arranged in parallel to the primary data lines 11 and, the auxiliary data lines 123 and the primary data lines 11 are arranged in a light shielding region between two adjacent columns of the sub-pixels. The second data lines 122 are connected to the sub-pixels in the second sub-display region A22 and the auxiliary data lines 123, and the second data lines 122 are connected to the auxiliary data lines 123 through via holes 22, and are connected to the data drive port 30 via the auxiliary data lines 123. The data drive port 30 provides data signals to the corresponding sub-pixels in the second sub-display region A22 sequentially through the auxiliary data lines 123 and the second data lines 122.

Moreover, in the embodiment, the auxiliary data lines 123 are connected to the first data lines 121 and connected to the corresponding data drive port 30 via the first data lines 121. For example, the first data lines 121 and the second data lines 122 connected to the same auxiliary data line 123 may be arranged on the same line that is extended in the first direction a, and the data drive port 30 provides data signals to the corresponding sub-pixels in the second sub-display region A22 sequentially through the first data lines 121, the auxiliary data lines 123 and the second data lines 122. In this case, the second data line 122 is connected to one corresponding first data line 121 so as to share the same data drive port 30, thereby reducing the number of ports of the drive circuit, reducing the area of the border, and thus reducing a cost.

Moreover, in the embodiment, the array substrate further includes a connection wire 21. The connection wire 21, for example, may be arranged to be extended in the second direction b. The auxiliary data lines 123 are connected to the corresponding second data lines 122 via the connection wire 21. Practically, in some embodiments, the auxiliary data lines 123 are connected to the corresponding first data lines 121 via the connection wire 21. In this way, the second data lines 122 are connected to the corresponding first data lines 121 via the auxiliary data lines 123 and the two different connection wires 21, thereby being connected to the corresponding data drive port 30.

In the embodiment, the thin film transistor T includes a gate, an active layer, a source and a drain. The data line is connected to one of the source and the drain of the corresponding thin film transistor T. The pixel electrode PX is connected to the other of the source and the drain of the corresponding thin film transistor T. The source and the drain of the thin film transistor T may be formed, for example, in the same layer as the data line. The gate of the thin film transistor T may be formed, for example, in the same layer as the scanning lines, or a part of the scanning lines may be multiplexed as the gate of the thin film transistor T.

The array substrate includes: a first metal layer M1 including the scanning lines, and a second metal layer M2 including the data lines. The first metal layer M1 is located between the second metal layer M2 and the substrate. For example, the second metal layer M2 is insulated and spaced from the first metal layer M1 through an insulating layer. The first metal layer M1 includes the gate of the array substrate and the scanning lines, and is configured to provide scanning signals to pixel units of the array substrate. The second metal layer M2 includes the source and the drain of the array substrate and the data lines 20, and is configured to provide data signals to the pixel electrode of the array substrate.

Moreover, in the embodiment, the second metal layer M2 may include the primary data lines 11, the first data lines 121 and the second data lines 122, and the auxiliary data lines 123 are arranged in the same layer as the first data lines 121 and the second data lines 122 and the auxiliary data lines 123 are made of the same material as the first data lines 121 and the second data lines 122. The array substrate further includes the connection wire 21 configured to connect the auxiliary data lines 123 and the second data lines 122 and connect the auxiliary data lines 123 and the first data lines 121. The connection wire 21, for example, may be formed in the same layer as the scanning lines 20. That is, the connection wire is located in the first metal layer M1. For example, the connection wire 21 may be arranged to be in parallel to the scanning lines 20, and the connection wire 21 and the scanning line 20 may be arranged in the light shielding region between two adjacent columns of the sub-pixels. The first data line 121, the second data line 122 and the auxiliary data line 123, for example, may be connected to the corresponding connection wire 21 through penetrating the via hole 22 of the insulating layer, thereby connecting the auxiliary data line 123 to the corresponding second data line 122 and connecting the auxiliary data line 123 to the corresponding first data line 121.

Moreover, the array substrate further includes common electrodes. The common electrodes and the pixel electrodes are located on a side of the data line and the scanning line facing away from the substrate. For each of the sub-pixels, under control of the scanning signal provided by the corresponding scanning line and the data signal provided by the corresponding data line, there is a voltage difference between the pixel electrode and the common electrode, thereby generating a parallel electric field.

In the present disclosure, the array substrate is provided with a hollowed-out region. Due to blocking of the hollowed-out region, some data lines may not penetrate the display region of the whole array substrate. In this case, the array substrate provided in the embodiment is adopted. For a region where the data line may be continuously arranged, that is, the primary display region, the primary data lines are arranged, and the primary data lines are directly connected to the data drive port, to charge the sub-pixels in the primary display region, thereby displaying a gray scale of the primary display region. For a region where the data lines are blocked, that is, the second sub-display region, the second data lines are separately arranged and connected to the corresponding data drive port via the auxiliary data lines arranged in the primary display region, to charge the sub-pixels in the second sub-display region so as to display a gray scale of the second sub-display region, thereby solving a problem of driving display of the hollowed-out region.

Moreover, in the embodiment, both the auxiliary data line and the connection wire are located in the display region, which does not occupy an area of the border region. Compared with a solution that the second data lines are extended into the border region and connected to the data drive port via a peripheral lead in the border region, the area of the border region is reduced, thereby being beneficial to achieve a narrow border.

Moreover, in the embodiment, the first data lines, the second data lines, the auxiliary data lines and the primary data lines are extended in the same direction. That is, all the data lines on the array substrate are wired uniformly and the sub-pixels of the whole array substrate can be arranged uniformly, such that the difference between the second sub-display region and the primary display region in a visual effect can be avoided, and the display panel including the array substrate has good overall uniformity.

Moreover, in the embodiment, the array substrate may be an annular array substrate of which a central portion is hollowed out. The display region and the hollowed-out region are circular, and a center of the display region coincides with a center of the hollowed-out region. In this case, the second data line located in the second sub-display region may be connected to the corresponding data drive port via the auxiliary data line located in the primary display region. In another embodiment, the second data line may be connected to the corresponding first data line via the auxiliary data line located in the primary display region, and thus is connected to the data drive port. Compared with a solution that the second data lines are extended into an inner border region of the array substrate (i.e., an edge of an annular display region near the circular hollowed-out region) and connected to the first data line via a lead in the inner border region, the area of the inner border can be reduced to a maximum degree, and even the inner border is unnecessary to be arranged, thereby increasing a display region ratio.

Moreover, referring to FIG. 1, FIG. 2 and FIG. 3, in the embodiment, the primary display region includes the first primary display region A11 and the second primary display region A12 arranged oppositely in the second direction b, and the second direction b and the first direction a intersect with each other. The auxiliary data lines 123 include first auxiliary data lines 1231 located in the first primary display region A11, and second auxiliary data lines 1232 located in the second primary display region A12. The second data lines 122 in the second sub-display region A22 near the first primary display region A11 are connected to the first auxiliary data lines 1231, and the second data lines 122 in the second sub-display region A22 near the second primary display region A12 are connected to the second auxiliary data line 1232. The number of the first auxiliary data lines 1231 is equal to the number of the second auxiliary data lines 1232. The first auxiliary data lines 1231 and the second auxiliary data line 1232 are uniformly arranged in the corresponding primary display region, thereby improving the uniformity of array substrate wiring and sub-pixel arrangement, and thus further improving the display uniformity.

With reference to FIG. 4, in the embodiment, the array substrate further includes multiple pixel units arranged in an array. Each of the pixel units includes a first sub-pixel P1, a second sub-pixel P2 and a third sub-pixel P3 arranged in a row direction. The first sub-pixel P1, the second sub-pixel P2 and the third sub-pixel P3 have different colors. In the present embodiment, for example, the first sub-pixel P1, the second sub-pixel P2, and the third sub-pixel P3 may be a red sub-pixel, a green sub-pixel, and a blue sub-pixel respectively. Practically, each of pixel units 104 may include two or more sub-pixels. In the primary display region, the auxiliary data lines 123 and the primary data lines 11 are arranged between two adjacent columns of the sub-pixels. For example, the auxiliary data. lines 123 may be arranged only between the third sub-pixel P3 of one pixel unit and the first sub-pixel P1 of another pixel unit. That is, the auxiliary data lines 123 and the primary data lines 11 are arranged in parallel only between the first sub-pixel P1 and the adjacent third sub-pixel P3, and only the primary data lines 11 are provided in other positions, thereby improving the overall uniformity of the display panel including the array substrate.

Figure 5:
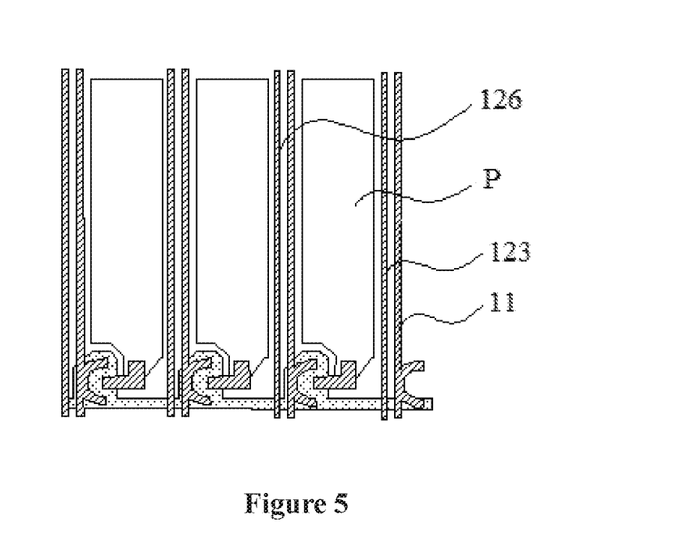
FIG. 5 is a schematic diagram of a pixel unit of an array substrate according to another embodiment of the present disclosure.

FIG. 5 is a schematic diagram of a pixel unit of an array substrate according to another embodiment of the present disclosure. The array substrate provided in this embodiment is similar to the array substrate provided in FIG. 4. The array substrate in FIG. 5 differs from the array substrate in FIG. 4 in that: the array substrate further includes virtual data lines 126, where the virtual data lines 126 and the primary data lines 11 are arranged in parallel in a light shielding region between adjacent sub-pixels P. For example, the auxiliary data lines 123 and the primary data lines 11 may be arranged in parallel in light shielding regions between some adjacent columns of the sub-pixels. The virtual data lines 126 and the primary data lines 11 are arranged in parallel in light shielding regions between other adjacent columns of the sub-pixels on the array substrate. In this way, the uniformity of the array substrate wiring is improved, thereby improving the display uniformity of the display panel including the array substrate. The virtual data line 126, for example, may be formed in the same layer as the auxiliary data lines 123. For example, the virtual data lines 126 may be arranged in the second metal layer.

Moreover, in the embodiment, the array substrate further includes common electrode signal lines (not shown in Figures), and the common electrode signal lines are connected to the common electrodes and the drive circuits to provide common voltage signals to the common electrodes. Both ends of the virtual data line 126 may be connected to the common electrode signal line via a via hole. In this case, the virtual data lines 126 are multiplexed as a part of the common electrode signal lines, thereby reducing a resistance of the common electrode signal lines and a delay of the common voltage signals, and improving the display quality.

Figure 6:
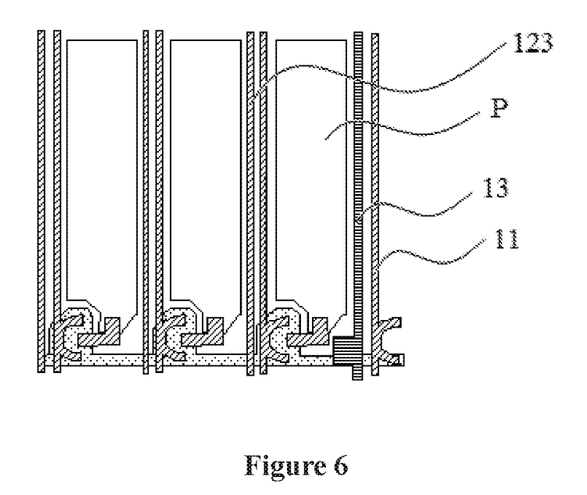
FIG. 6 is a schematic diagram of a pixel unit of an array substrate according to another embodiment of the present disclosure.
Figure 7:
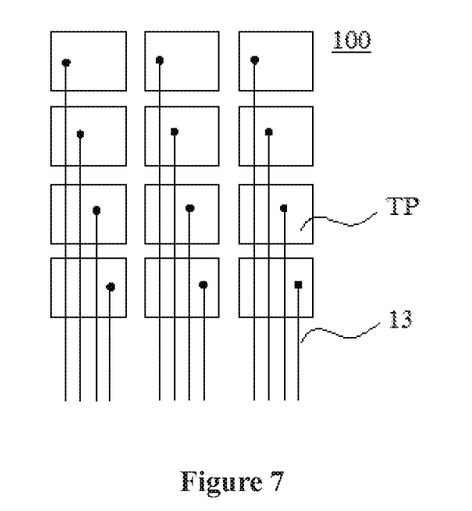
FIG. 7 is a schematic diagram of a touch detection structure according to an embodiment of the present disclosure.

FIG. 6 is a schematic diagram of a pixel unit of an array substrate according to another embodiment of the present disclosure, and FIG. 7 is a schematic diagram of a touch detection structure according to an embodiment of the present disclosure. The array substrate provided in this embodiment is similar to the array substrate provided in FIG. 4. The array substrate in this embodiment differs from the array substrate in FIG. 4 in that: the array substrate is integrated with a touch detection function, and includes a touch detection structure. A touch mode of the touch detection structure may be self-capacitance, mutual capacitance, or pressure sensitive touch, which is not limited in the present disclosure. Taking the self-capacitance touch mode as an example, the touch detection structure 100 includes multiple touch electrodes TP arranged in an array and multiple touch signal lines 13, and each of the touch electrodes TP is electrically connected to a touch drive port configured to output a scanning signal and receive a detection signal in the drive circuit via the corresponding touch signal line 13. When a user touches, a capacitance between a touch electrode TP corresponding to a touch position and the ground changes, such that a detection signal on the touch signal line 13 at the touch position changes, the touch drive port can determine the touch position based on the received detection signal, and the display panel including the array substrate performs a corresponding operation. The touch electrodes, for example, may be formed in the same layer as the common electrodes. In another embodiment, the common electrodes are multiplexed as the touch electrodes in a time to division manner, thereby performing the touch operation and the display operation in a time division manner. The touch signal line may be formed by metal wires additionally arranged, and may be electrically connected to the corresponding touch electrode via, for example, a connection hole, thereby reducing the touch resistance and improving the sensitivity of the touch detection.

In this embodiment, the touch signal lines 13 and the primary data lines 11 are arranged in parallel in the light shielding region between two adjacent columns of the sub-pixels P. For example, the auxiliary data lines 123 and the primary data lines 11 may be arranged in parallel in shielding regions between some adjacent columns of the sub-pixels. The touch signal lines 13 and the primary data lines 11 are arranged in parallel in shielding regions between other adjacent columns of the sub-pixels on the array substrate. In this way, the uniformity of the array substrate wiring is improved, thereby improving the display uniformity of the display panel including the array substrate.

In another embodiment, in the array substrate integrated with the touch detection function, for ensuring the display uniformity, the sub-pixels are arranged uniformly and shapes and areas of opening regions (transparent regions) of the sub-pixels are substantially the same, and shapes and areas of light shielding regions (between two adjacent sub-pixels) of the sub-pixels are also substantially the same, and a width of the light shielding region provided with the touch signal lines is substantially the same as a width of the light shielding region provided with no touch signal lines. Hence, adding the auxiliary data lines having the same extension direction as an extension direction of the touch signal lines in light shielding region provided with no touch signal lines does not additionally occupy the opening region of the sub-pixels, and introduction of the auxiliary data lines does not reduce the area of the opening region.

Practically, in other embodiments, the array substrate may further include the auxiliary data lines, the virtual data lines and the touch signal lines. In addition to the data line, any one of the auxiliary data line, the virtual data line and the touch signal line may be arranged between two adjacent columns of the sub-pixels.

Figure 8:
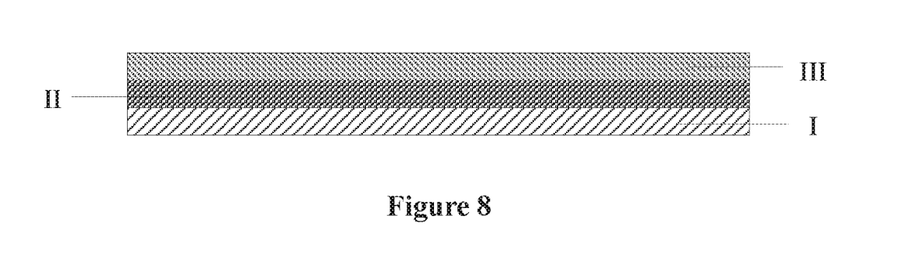
FIG. 8 is a schematic diagram of a display panel.

A display panel is further provided according to the present disclosure, as shown in FIG. 8, which includes an opposed substrate and any of the array substrates described above. The opposed substrate includes a hollowed-out region, as the array substrate. The display panel may be, for example, a liquid crystal display panel including an array substrate and a color film substrate arranged oppositely.

Figure 9:
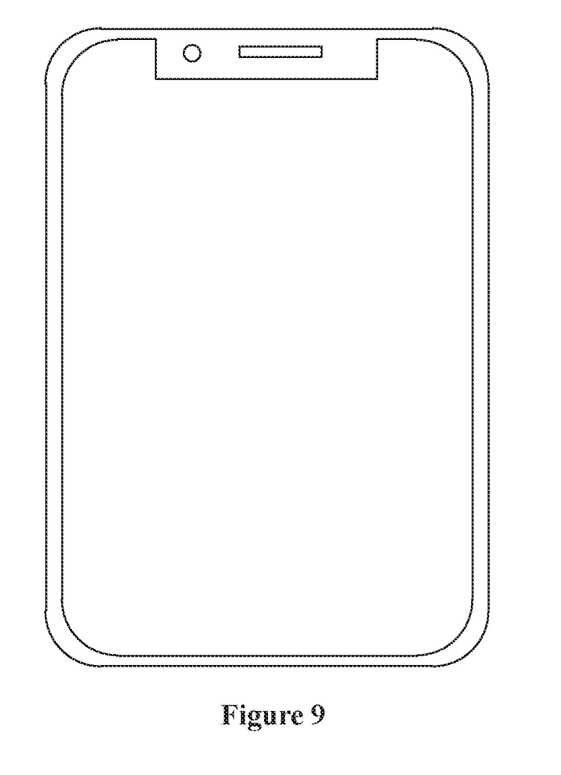
FIG. 9 is a schematic diagram of a display device.

A display device is further provided according to the present disclosure, as shown in FIG. 9, which includes the display panel and a housing. The housing forms an accommodating space for accommodating the display panel. The housing may be hard or flexible, which is not limited in the present disclosure. It may be understood that the display device provided by the embodiment of the present disclosure may be a display device with a display function, such as a computer, a television, or a vehicle-mounted display device, which is not limited in the present disclosure.

The display panel, for example, may be an annular display panel, and the display device is an annular display device correspondingly.

It may be known from the above embodiments that, the array substrate, the display panel including the array substrate, and the display device provided by the present disclosure achieve the following beneficial effects. The array substrate is provided with a hollowed-out region. Due to blocking of the hollowed-out region, sonic data lines may not penetrate the display region of the whole array substrate. In this case, the array substrate provided in the embodiment is adopted. For a region where the data lines may be arranged continuously, that is, a primary display region, primary data lines are arranged, and the primary data lines are directly connected to a data drive port to charge the sub-pixels in the primary display region, thereby displaying a gray scale of the primary display region. For a region where the data lines are blocked, that is, a second sub-display region, the second data lines are arranged separately and connected to the corresponding data drive port via the auxiliary data lines arranged in the primary display region to charge the sub-pixels in the second sub-display region, thereby displaying a gray scale of the second sub-display region, and thus solving a problem of driving display of the hollowed-out region. The first data lines, the second data lines, the auxiliary data lines and the primary data lines are extended in the same direction. That is, all the data lines on the array substrate are wired uniformly, and the sub-pixels in the whole display panel are arranged uniformly, such that the difference between the first sub-display region, the second sub-display region and the primary display region in a visual effect can be avoided, and the display panel has good overall uniformity.

The invention claimed is:

1. An array substrate, comprising:
   a display region;
   a border region surrounding the display region;
   a data drive port;
   primary data lines;
   second data lines; and
   auxiliary data lines, wherein
      the border region comprises a first border and a second border arranged oppositely in a first direction;
      the display region comprises a hollowed-out region, a second sub-display region and a primary display region, and the second sub-display region is a region from an edge of the hollowed-out region near the second border to the second border;
      the data drive port is arranged in the first border, the second data lines are arranged in the second sub-display region, the auxiliary data lines are arranged in the primary display region, and the second data lines and the auxiliary data lines are extended in the first direction; and
      the second data lines are connected to the corresponding auxiliary data lines and sub-pixels in the second sub-display region, and the auxiliary data lines are connected to the data drive port.

2. The array substrate according to claim 1, further comprising: a connection wire, wherein the second data lines are connected to the auxiliary data lines via the connection wire.

3. The array substrate according to claim 2, further comprising:
   a first sub-display region, wherein the first sub-display region is a region from an edge of the hollowed-out region near the first border to the first border; and
   first data lines, wherein the first data lines are connected to the data drive port and sub-pixels in the first sub-display region, and the auxiliary data lines are connected to the corresponding first data. lines via the connection wire.

4. The array substrate according to claim 2, further comprising: a first metal layer and a second metal layer arranged in an insulating manner and spaced from each other, wherein the first metal layer comprises the connection wire, and the second metal layer comprises the second data lines, the auxiliary data lines and the primary data lines.

5. The array substrate according to claim 4, wherein the first metal layer further comprises scanning lines.

6. The array substrate according to claim 1, wherein the display region further comprises a plurality of sub-pixels arranged in an array, and the auxiliary data lines and primary data lines are arranged in parallel between two adjacent columns of the sub-pixels.

7. The array substrate according to claim 6, further comprising: virtual data lines and common electrode signal lines, wherein
   the virtual data lines are electrically connected to the common electrode signal lines; and
   the primary data line and one of the auxiliary data line and the virtual data line are arranged between two adjacent columns of the sub-pixels, in the primary display region.

8. The array substrate according to claim 6, further comprising: touch electrodes and touch signal lines, wherein the touch signal lines are connected to the corresponding touch electrodes; and the primary data line and one of the auxiliary data line and the touch signal line are arranged between two adjacent columns of the sub-pixels, in the primary display region.

9. The array substrate according to claim 1, wherein the primary display region comprises a first primary display region and a second primary display region arranged oppositely in a second direction, and the second direction and the first direction intersect with each other; and the auxiliary data lines comprise first auxiliary data lines located in the first primary display region and second auxiliary data lines located in the second primary display region, and the number of the first auxiliary data lines is equal to the number of the second auxiliary data lines.

10. The array substrate according to claim 1, wherein the display region and the hollowed-out region are circular, and a center of the display region coincides with a center of the hollowed-out region.

11. A display panel, comprising an array substrate, wherein the array substrate comprises:

a display region;

a border region surrounding the display region;

a data drive port;

primary data lines;

second data lines; and auxiliary data lines, wherein the border region comprises a first border and a second border arranged oppositely in a first direction;

the display region comprises a hollowed-out region, a second sub-display region and a primary display region, and the second sub-display region is a region from an edge of the hollowed-out region near the second border to the second border;

the data drive port is arranged in the first border, the second data lines are arranged in the second sub-display region, the auxiliary data lines are arranged in the primary display region, and the second data lines and the auxiliary data lines are extended in the first direction; and the second data lines are connected to the corresponding auxiliary data lines and sub-pixels in the second sub-display region, and the auxiliary data lines are connected to the data drive port.

12. A display device, comprising:

a display panel, comprising an array substrate, wherein the array substrate comprises:

a display region;

a border region surrounding the display region;

a data drive port;

primary data lines;

second data lines; and auxiliary data lines, wherein the border region comprises a first border and a second border arranged oppositely in a first direction;

the display region comprises a hollowed-out region, a second sub-display region and a primary display region, and the second sub-display region is a region from an edge of the hollowed-out region near the second border to the second border;

the data drive port is arranged in the first border, the second data lines are arranged in the second sub-display region, the auxiliary data lines are arranged in the primary display region, and the second data lines and the auxiliary data lines are extended in the first direction; and the second data lines are connected to the corresponding auxiliary data lines and sub-pixels in the second sub-display region, and the auxiliary data lines are connected to the data drive port.

* * * * *